(12) United States Patent
Kano et al.

(10) Patent No.: US 6,490,784 B1
(45) Date of Patent: Dec. 10, 2002

(54) AUTOMATIC ELECTRONIC COMPONENT-MOUNTING APPARATUS

(75) Inventors: Yoshinori Kano, Gunma-ken (JP); Yoshinao Usui, Gunma-ken (JP); Takahiro Nagata, Gunma-ken (JP)

(73) Assignee: Sanyo Electric Co., Ltd., Osaka-Fu (JP)

( * ) Notice: Subject to any disclaimer, the term of this patent is extended or adjusted under 35 U.S.C. 154(b) by 0 days.

(21) Appl. No.: 09/490,856

(22) Filed: Jan. 24, 2000

(30) Foreign Application Priority Data

Jan. 25, 1999 (JP) .......................................... 11-015957

(51) Int. Cl.$^7$ ................................................ B23P 19/00
(52) U.S. Cl. ............................ 29/740; 29/739; 29/741; 29/742; 29/743; 29/744; 29/759; 29/760; 29/833; 29/837; 29/842; 29/845; 29/846
(58) Field of Search .......................... 29/739, 740, 741, 29/742, 743, 744, 759, 760, 833, 839, 842, 845, 846

(56) References Cited

U.S. PATENT DOCUMENTS

| | | | | |
|---|---|---|---|---|
| 4,794,689 A | * | 1/1989 | Seno .............................. | 29/740 |
| 5,218,753 A | * | 6/1993 | Suzuki .......................... | 29/740 |
| 5,279,625 A | * | 1/1994 | O'Neil-Bell ................. | 29/623.4 |
| 5,449,272 A | * | 9/1995 | Boyd et al. ............... | 415/209.2 |
| 5,452,509 A | * | 9/1995 | Suzuki .......................... | 29/740 |
| 5,637,177 A | * | 6/1997 | Os .............................. | 156/286 |
| 5,740,604 A | * | 4/1998 | Kitamura ..................... | 29/832 |
| 5,794,329 A | * | 8/1998 | Rossmeisl .................... | 29/743 |
| 5,815,912 A | * | 10/1998 | Willshere .................... | 29/721 |
| 5,907,900 A | * | 6/1999 | Okazaki ....................... | 29/740 |
| 5,926,950 A | * | 7/1999 | Asai ............................. | 29/832 |
| 6,058,599 A | * | 5/2000 | Hanamura .................... | 29/740 |
| 6,079,096 A | * | 6/2000 | Hata ............................. | 29/740 |
| 6,212,751 B1 | * | 4/2001 | Hattori ..................... | 29/407.04 |
| 6,219,897 B1 | * | 4/2001 | Inutsuka .................... | 29/281.1 |
| 6,256,869 B1 | * | 7/2001 | Asai ............................. | 29/740 |
| 6,351,387 B1 | * | 2/2002 | Prasher ....................... | 361/234 |
| 6,351,389 B1 | * | 2/2002 | Malladi ....................... | 361/760 |
| 6,391,437 B1 | * | 5/2002 | Kadomura et al. ...... | 428/307.3 |

FOREIGN PATENT DOCUMENTS

| | | | | |
|---|---|---|---|---|
| JP | 05192824 | 8/1993 | .......... | B23P/19/04 |
| JP | 08195582 | 7/1996 | .......... | H05K/13/04 |

\* cited by examiner

*Primary Examiner*—Carl J. Arbes
*Assistant Examiner*—Paul D Kim
(74) *Attorney, Agent, or Firm*—Darby & Darby (57) ABSTRACT

An automatic electronic component-mounting apparatus is provided. A nut member is slidably arranged between a pair of rails. A head-lifting/lowering member is lowered and lifted with respect to the main block via the pair of rails and the nut member. A mounting head is attached to the head-lifting/lowering member. The head-lifting/lowering member is lowered and lifted to cause the mounting head to pick up an electronic chip component and then mount the electronic chip component on a printed circuit board. The head-lifting/lowering member is formed of a metal-ceramic composite material produced by combining a ceramic reinforcing material with a metal.

10 Claims, 8 Drawing Sheets

AUTOMATIC ELECTRONIC COMPONENT-MOUNTING APPARATUS

BACKGROUND OF THE INVENTION

1. Field of the Invention

This invention relates to an automatic electronic component-mounting apparatus in which a mounting head is lifted/lowered to thereby pick up electronic chip components by vacuum and mount the components on a printed circuit board.

2. Prior Art

Conventionally, an automatic electronic component-mounting apparatus is known in which each electronic chip component is picked up from a component-feeding device by a vacuum nozzle arranged on a mounting head and mounted on a printed circuit board (as disclosed e.g. in Japanese Laid-Open Patent Publication (Kokai;) No. 5-192824).

However, in the above electronic component-mounting apparatus, since each mounting head is mounted on an outer periphery of a rotary table via a guide rod having the mounting head attached thereto and extending through the rotary table, the rotary table is required to have a large radial dimension, which makes it impossible to reduce the size and weight of the apparatus. In mounting the mounting head on the rotary table, a ball holding-type linear guide (e.g. CAT-1777 or CAT-1770 produced by Nippon Thompson Co. Ltd.) can be employed. However, if the CAT-1777 type linear guide is used, the radial dimension of the rotary table is also required to be large, and besides, rigidity of the rotary table is not high enough. On the other hand, if the CAT-1770 type linear guide is used, adjustment by a setscrew for setting a preload is required. This makes the setting of the preload troublesome and difficult, and hence adjustment for the assembly takes too long time.

To overcome the above problems, there was proposed a technique by Japanese Laid-Open Patent Publication (Kokai) No. 8-195582, in which an electronic component-mounting apparatus is provided with a head-lifting/lowering mechanism having a pair of rails and a nut member which is slightly larger in thickness than the pair of rails and slidably arranged between the pair of rails, the nut member of the head-lifting/lowering mechanism being secured to the rotary table and the pair of rails being secured to a head-lifting/lowering member.

In the above device, when tact time of mounting each electronic component is reduced, i.e. when the cycle of operation of the head-lifting/lowering mechanism is shortened, the mounting head is lifted/lowered at high speed, with fast sliding of the nut member over the rails. As a result, the rails, the nut member, and the head-lifting/lowering member are heated to a high temperature. The nut member and rails are required to be sufficiently rigid for serving as a bearing, so that in general, they are formed of stainless steel. On the other hand, the head-lifting/lowering member, which is required to be light, is formed of aluminum. Therefore, if the members are excessively heated, a difference in the coefficient of thermal expansion between stainless steel and aluminum causes a considerable difference in thermal expansion between the nut member and rails and the head-lifting/lowering member, which hinders the speed of mounting of electronic components from being increased.

More specifically, since stainless steel has a smaller coefficient of thermal expansion than that of aluminum, the rails and the head-lifting/lowering member are deformed due to the bimetal effect. Further, since the head-lifting/lowering member is secured to the pair of rails, a distance between the pair of rails becomes larger than a width of the nut member, and hence gaps between the respective rails and the nut member expand. As a result, a preload applied by balls interposed between the nut member and the respective rails is decreased or even lost.

However, if the head-lifting/lowering member were also formed of a ferrous material, such as stainless steel, so as to avoid the above inconvenience, the weight of the head-lifting/lowering member would be increased, which also hinders high-speed mounting of electronic components.

SUMMARY OF THE INVENTION

It is an object of the invention to provide an automatic electronic component-mounting apparatus, which is capable of mounting electronic components at high speed without being affected by thermal expansion of the relevant components.

To attain the above object, the present invention provides an automatic electronic component-mounting apparatus including a main block, a pair of rails, a nut member which is slidably arranged between the pair of rails, a head-lifting/lowering member which is lowered and lifted with respect to the main block via the pair of rails and the nut member, and a mounting head attached to the head-lifting/lowering member, the head-lifting/lowering member being lowered and lifted to cause the mounting head to pick up an electronic chip component and then mount the electronic chip component on a printed circuit board.

The electronic component-mounting apparatus according to the invention is characterized in that the head-lifting/lowering member is formed of a metal-ceramic composite material produced by combining a ceramic reinforcing material with a metal.

According to this automatic electronic component-mounting apparatus, even when the rails and the nut members are formed of a ferrous material, such as stainless steel, which has a high strength, it is possible to provide a head-lifting/lowering member which has a coefficient of thermal expansion close to that of the ferrous material and is light in weight.

Preferably, the metal is aluminum or an aluminum alloy.

More preferably, a volume fraction of the ceramic reinforcing material is approximately 30%.

According to these preferred embodiments, it is possible to make the thermal expansion coefficient of the head-lifting/lowering member close to that of the ferrous material such as stainless steel and avoid degradation of machinability of the head-lifting/lowering member.

Preferably, the nut member is slightly larger in thickness than the pair of rails and is secured to the main block, and the pair of rails are secured to the head-lifting/lowering member.

According to this preferred embodiment, adjustment of a preload set by balls interposed between the rails and the nut member is facilitated, which contributes to reduction of time required for adjustment of the assembly.

Preferably, the main block comprises a rotary table, and a plurality of the head-lifting/lowering members arranged on a periphery of the rotary table.

According to this preferred embodiment, since the head-lifting/lowering members, which conventionally readily undergo thermal expansion when heated due to their frequent vertical sliding motions, are no longer susceptible to the problem of thermal expansion, it is possible to carry out the mounting of components at a high speed.

The above and other objects, features, and advantages of the invention will become more apparent from the following detailed description taken in conjunction with the accompanying drawings.

DETAILED DESCRIPTION

The invention will now be described in detail with reference to drawings showing embodiments thereof.

Figure 1:
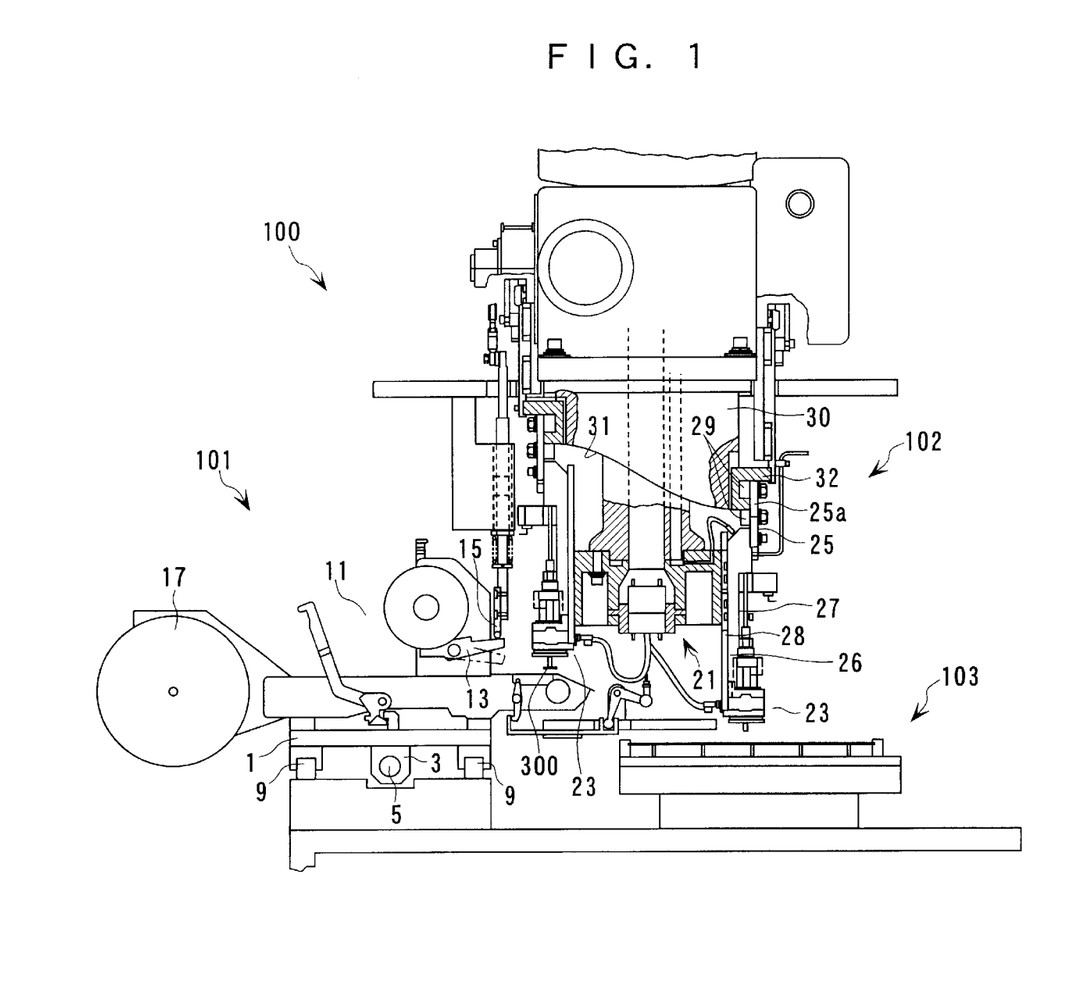
FIG. 1 is a side view of an automatic electronic component-mounting apparatus according to an embodiment of the invention.
Figure 2:
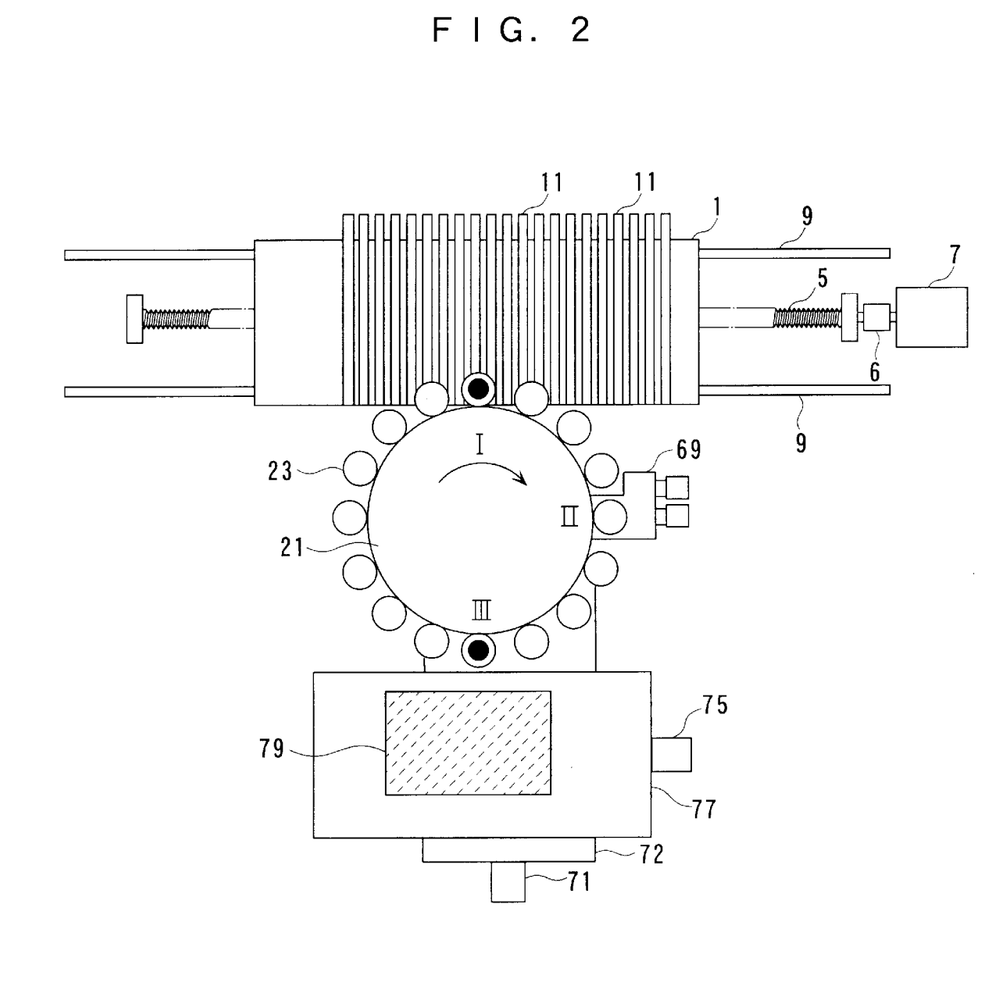
FIG. 2 is a plan view of the FIG. 1 automatic electronic component-mounting apparatus.

Referring first to FIGS. 1 and 2, reference numeral 100 designates an automatic electronic component-mounting apparatus for automatically mounting electronic chip components on a printed circuit board. The automatic electronic component-mounting apparatus 100 is comprised of a component-feeding section 101, a pick-up section 102, and a mounting section 3.

First, the component-feeding section 101 will be described.

The component-feeding section 101 has a feed table 1 integrally formed with a nut 3 through which a ball screw 5 extends. The ball screw 5 is connected to a motor 7 via a coupling 6. When the motor 7 drives the ball screw 5, the feed table 1 is guided by a pair of linear guides 9 and 9 for reciprocating motion in the X direction.

On the feed table 1, there are arranged a plurality of component-feeding devices 11 each provided with a lever 13 (see FIG. 1).

The lever 13 is engaged with a lift lever 15 and performs pivotal motion in accordance with vertical motion of the lift lever 15. With pivotal motion of the lever 13, a tape wound around a tape reel 17 is rolled out toward the pick-up section 102, described in detail hereinafter, whereby each chip component received in the tape is fed to a suction station I (see FIG. 2) in the pick-up section 102.

The pick-up section 102 includes a rotary table 21 (see FIG. 1) which can rotate intermittently, and a plurality of mounting heads 23, 23, . . . 23 are arranged at circumferentially equal intervals on an outer periphery of the rotary table 21.

Each mounting head 23 is secured to a lower end of each head-lifting/lowering member 26, which is secured to a pair of rails 28. The pair of rails 28 are supported in a vertically movable manner by nut members 27 fixed to the outer periphery of the rotary table 21. A bracket 25 is attached to an upper end of the head-lifting/lowering member 26 in a manner extending upward. The bracket 25 has an upper end portion 25a at which a pair of cam followers 29 are mounted such that the cam followers sandwich a rib-cam 31 fixed to an outer periphery of a support table 30, from above and below, respectively. With the intermittent rotation of the rotary table 21, the cam followers 29 move on the rib-cam 31 according to a profile of the rib-cam 31, whereby the mounting head 23 secured to the bracket 25 via the head-lifting/lowering member 26 is lifted/lowered while rotating in unison with the rotary table 21.

The rib-cam 31 has two cutout portions, not shown. When the pair of cam followers are brought into any one of the two cutout portions, a lift element 32 positioned in each of the two cut-out portions starts to be driven by a cam, not shown, for being lowered and lifted through the cutout portion whereby the mounting head 23 is lifted/lowered in unison with the lift element 32.

The two cutout portions mentioned above correspond, respectively, to the suction station I and amounting station III, each of which is shown in FIG. 2. At the suction station I, the mounting head 23 is lowered and lifted to pick up an electronic component supplied, while at the mounting station III, the mounting head 23 is lowered and lifted to mount the electronic component on a printed circuit board, as described hereinafter.

The mounting head 23 includes a pulse motor, not shown, which incorporates a stator, not shown, and a rotor, not shown, fitted in the stator via a bearing. This motor enables the mounting head 23 itself to perform rotation.

The rotor incorporated in the mounting head 23 has six vacuum nozzles 51 arranged at circumferentially equal intervals such that they extend vertically movably through the rotor.

Next, the operation of the electronic component-mounting apparatus 100 will be described.

When the mounting head 23 having the vacuum nozzles 51 mounted thereon is brought to the suction station I in the pick-up section 102 by the intermittent rotation of the rotary table 21, the rotation of the rotary table 21 is once stopped, and then the mounting head 23 is lowered as described above to allow a selected one of the vacuum nozzles 51 to pick up a chip component 300 by vacuum at its distal end.

When the chip component 300 is picked up, the mounting head 23 is lifted, and the rotary table 21 is rotated again.

Referring to FIG. 2, when the mounting head 23 carrying the chip component 300 is brought to a component-sensing station II by the intermittent rotation of the rotary table 21, a component-sensing device 69 is operated to sense the chip component 300 to check for displacement thereof with respect to the vacuum nozzle 51. If the chip component 300 is displaced with respect to the vacuum nozzle 51, the displacement is compensated for at any of stations from the component-sensing station II to the mounting station III. The station at which the displacement is compensated for is not indicated in the figure, and description thereof is omitted.

When the mounting head 23 carrying the chip component 300 is brought to the mounting station III by the intermittent rotation of the rotary table 21 after compensating for the displacement of the chip component 300, the rotation of the rotary table 21 is stopped, and the mounting head 23 is lowered as described above, whereby the chip component 300 at the distal end of the vacuum nozzle 51 is mounted on a printed circuit board which has been fed to the component-mounting section 103, described hereinafter.

When the chip component 300 is mounted on the printed circuit board, rotation of the rotary table 21 is resumed, whereby the mounting head 23 is brought to a station subsequent to the mounting station III, where the mounting head 23 is lowered until the distal end of the vacuum nozzle 51 strikes against a nozzle stopper, not shown, whereby the vacuum nozzle 51 is retracted and then held by a nozzle-holding mechanism, not shown.

Also referring to FIG. 2, the component-mounting section 103 includes a Y table 72 which is driven by a Y-axis motor 71 to move in the Y direction and an X-Y table 77 which is driven by an X-axis motor 75 to move on the Y table 72 in the X direction. Since the X-Y table 77 arranged on the Y table 72 also moves in the Y direction together with the Y table 72, it moves in both X and Y directions. An adhesive printed circuit board 79 is transferred onto the X-Y table 77 from a feed block, not shown, adjacent to the X-Y table 77, and the chip component 300 is mounted on the printed circuit board 79.

Figure 3:
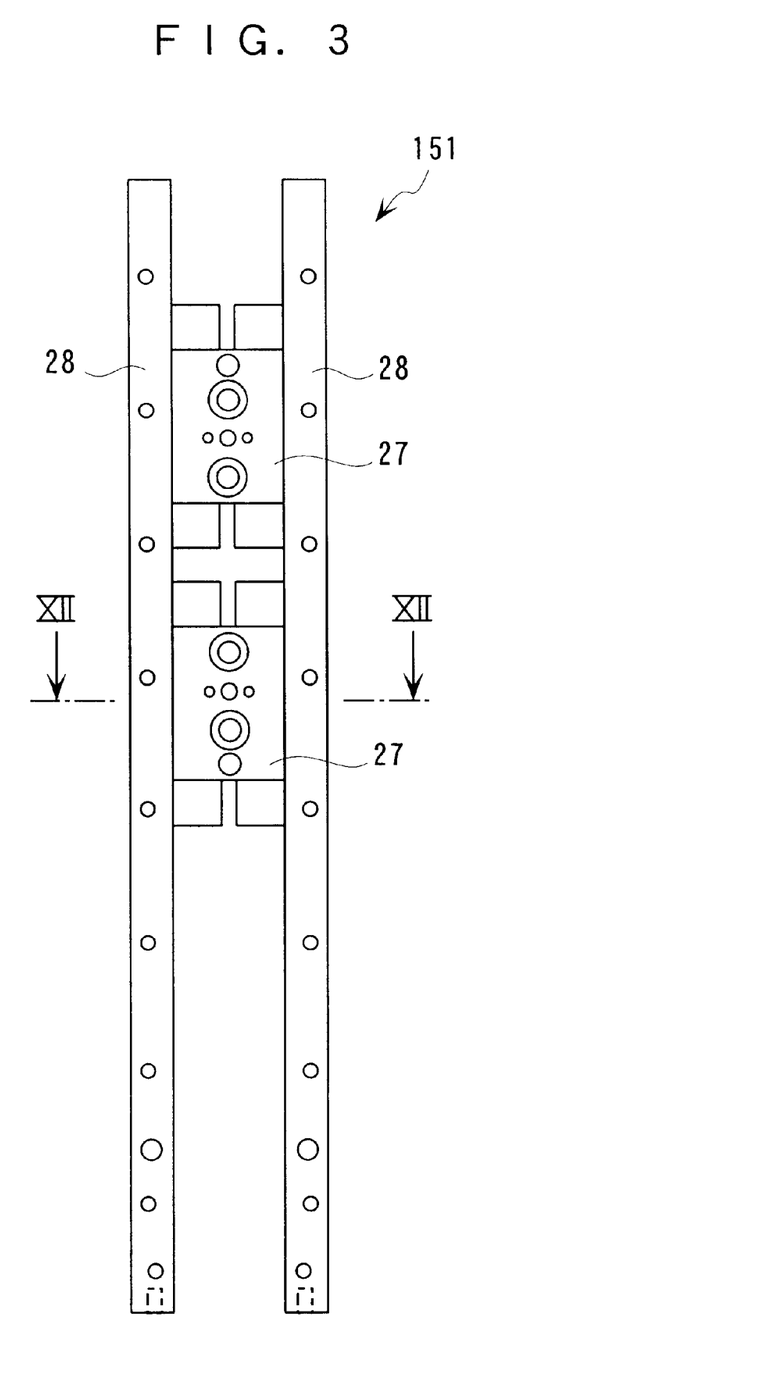
FIG. 3 is a plan view showing a pair of rails and nut members.
Figure 4:
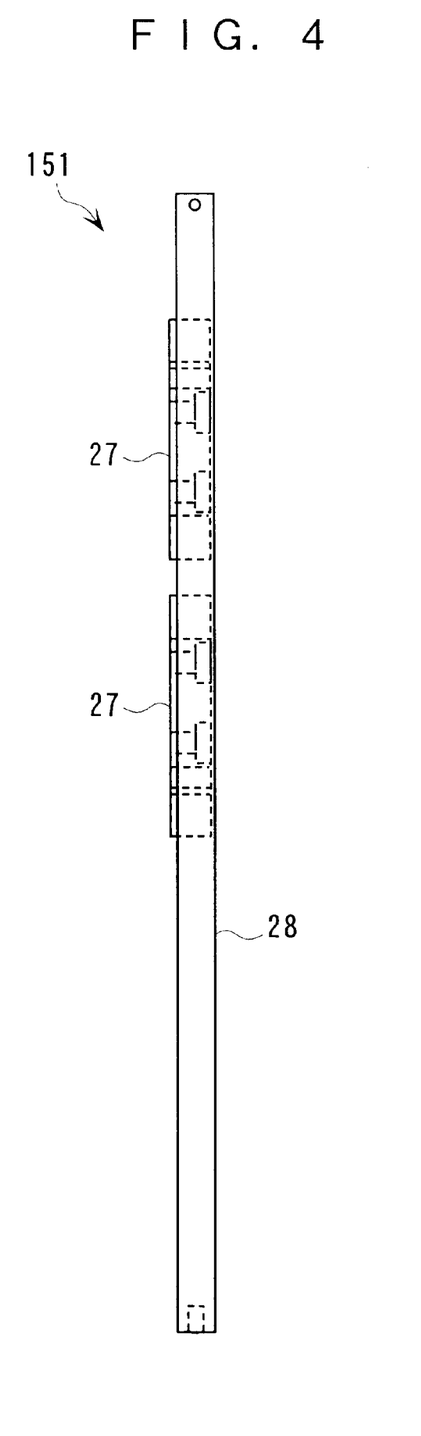
FIG. 4 is a side view of FIG. 3.

Referring next to FIGS. 3 and 4, the mounting head 23 is attached to a head-lifting/lowering mechanism 151. Similarly to the head-lifting/lowering mechanism described in Prior Art, the head-lifting/lowering mechanism 151 is comprised of the pair of rails 28 and the nut members 27 which are slightly larger in thickness than the pair of rails 28 and slidably arranged between the pair of rails 28.

Figure 5:
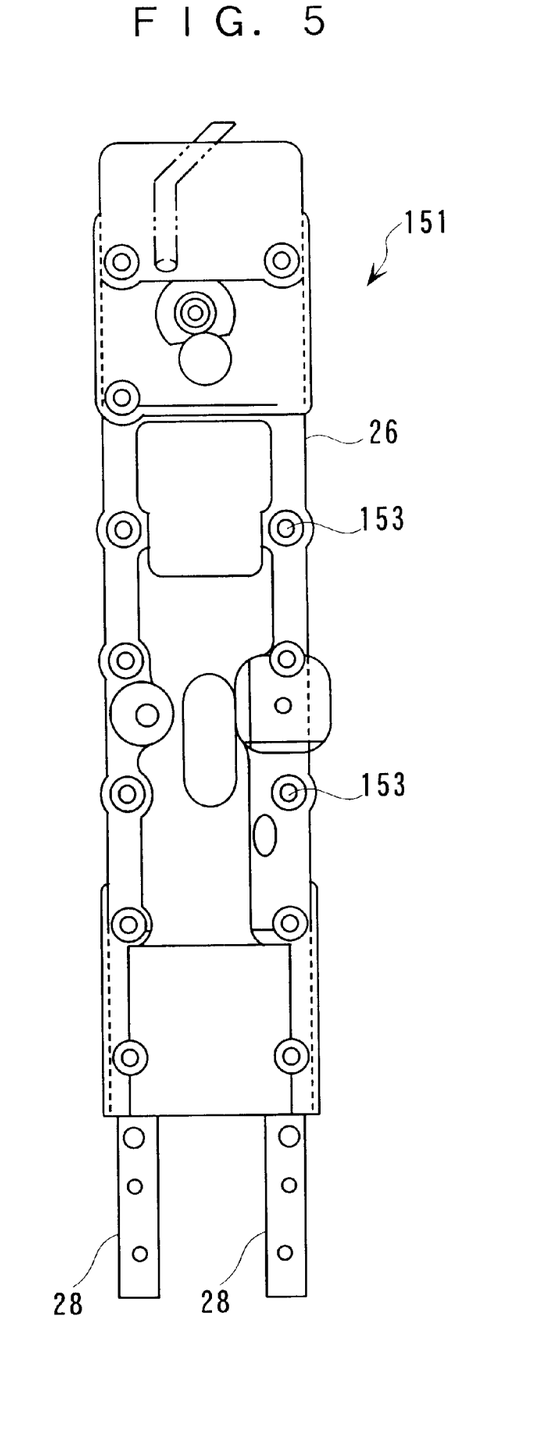
FIG. 5 is a plan view showing the pair of rails and a head-lifting/lowering member mounted thereon.
Figure 6:
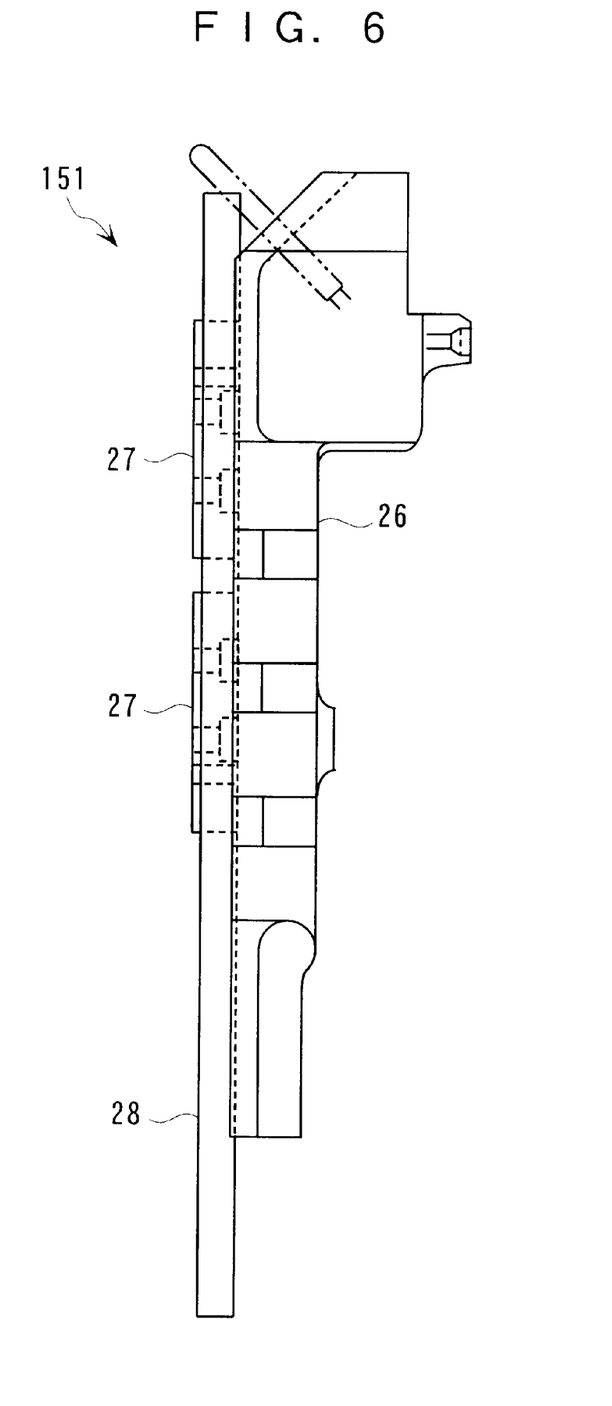
FIG. 6 is a side view of FIG. 5.

The nut members 27 of the head-lifting/lowering mechanism 151 are secured to the rotary table 21, while the pair of rails 28 are secured to the head-lifting/lowering member 26 by the use of machine screws 153, as shown in FIGS. 5 and 6.

Figure 7:
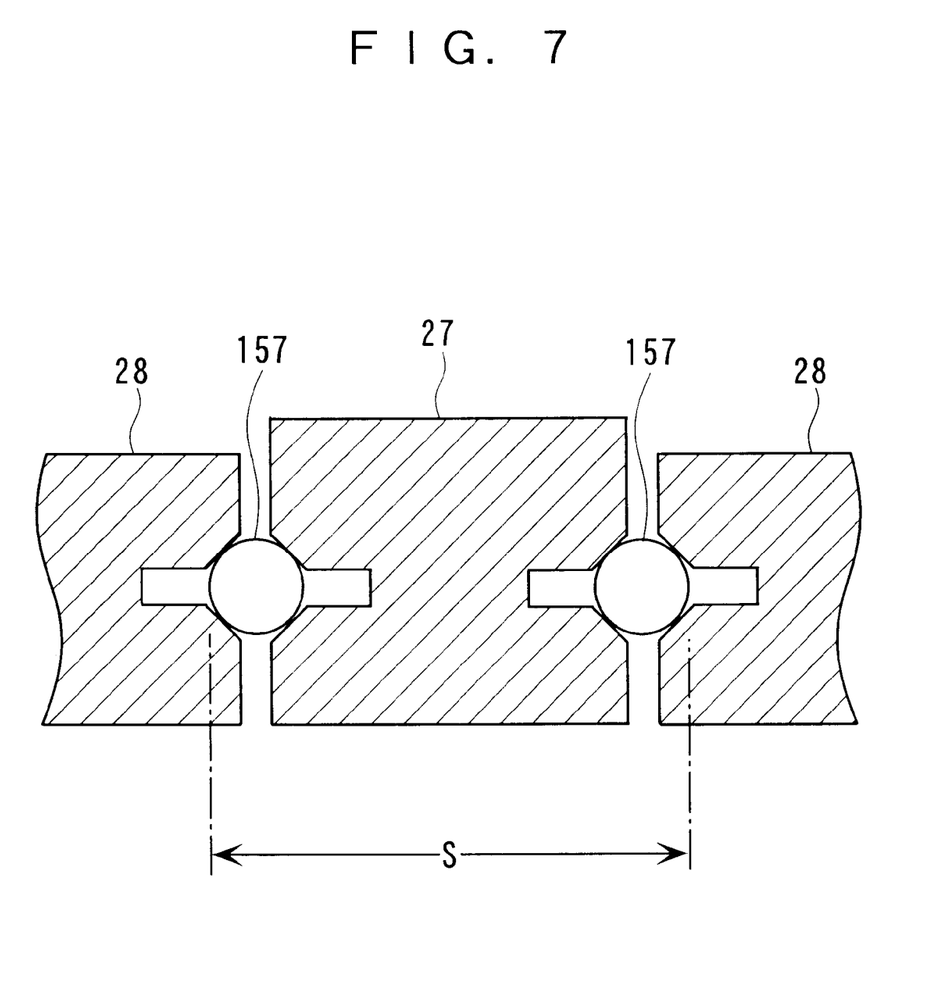
FIG. 7 is a cross-sectional view taken on line XII—XII of FIG. 3.

Referring next to FIG. 7, between the pair of rails 28 and opposite sides of the respective nut members 27, there are interposed balls 157 for slidably supporting the nut members 27 between the pair of rails 28. The balls 157 having a suitable size can be selected for use from balls 157 provided, for adjustment of a preload between the pair of rails 28 and the nut members 27. The provided balls 157 have various sizes in increments of 0.5 $\mu$m.

This facilitates the adjustment of the preload between the rails and the nut members. Now, sequential operations for the adjustment of the preload will be described. First, the head-lifting/lowering member 26 is secured to the pair of rails 28 as shown in FIGS. 5 and 6, and a rail span S (see FIG. 7) between the rails 28 is measured after machining of ball-receiving grooves. Then, the balls 157 are once fitted in the nut members 27 and in this state, a nut member span S', not shown, is measured. Thereafter, the size of the balls 157 is changed according to a difference between the spans S and S' such that the difference is compensated for while permitting the balls 157 to apply a sufficient preload. Suitable balls 157 are selected out of the balls 157 provided as described above.

Then, finally, the head-lifting/lowering mechanism 151 having undergone the adjustment of the preload is mounted on the outer periphery of the rotary table 21 which serves as a main block of the automatic electronic component-mounting apparatus.

In short, the present embodiment enables extremely easy adjustment of assembly of the head-lifting/lowering mechanism 151. Further, since the pairs of rails 28 and the nut members 27 are each formed to be small in thickness, the radial dimension of the rotary table 21 is reduced, which contributes to reduction of the size and weight of the electronic component-mounting apparatus. Moreover, the embodiment is advantageous in that since conventional adjustment of the preload is not required, it is possible to carry out the adjustment of assembly of the apparatus in a short time period.

The head-lifting/lowering member 26 is formed of a metal-ceramic composite material. More specifically, the material is produced by combining a ceramic reinforcing material consisting of silicon carbide with a metal such as aluminum or an aluminum alloy. For instance, the head-lifting/lowering member 26 can be formed of CSI-30 produced by Celanx K.K., which is an MMC (metal matrix composite) containing SiC ceramic at a volume fraction of 30%. The head-lifting/lowering member 26 formed of the metal-ceramic composite material CSI-30 is produced by so-called a casting process in which an ingot of CSI-30, i.e. a ceramic particles-dispersed aluminum-based composite ingot (SiC 30%) is melted in a crucible, and then poured into a mold. That is, a conventional process of casting aluminum alloy, such as sand mold casting, die casting, squeeze casting, shell molding, a lost wax process, or the like can be employed for the purpose.

The metal matrix composite CSI-30 has a coefficient of thermal expansion of $14.4 \times 10^{-6}/°$ C. at 200° C., which is closer to the coefficient of thermal expansion of stainless steel than that of thermal expansion of aluminum ($23 \times 10^{-6 °}$ C.) is. Further, the material CSI-30 which has a Young's modulus of 12500 kgf/mm$^2$ is stronger than aluminum which has a Young's modulus of 8000 kgf/mm$^2$.

The relatively low ceramic content of CSI-30 makes machining, such as cutting, less difficult than in the case of machining the same kind of material with a higher ceramic content. Besides, the weight of CSI-30 having a density of 2.78 kg/m$^3$ is generally the same as those of aluminum-based materials, which makes it possible to reduce the weight of the head-lifting/lowering member 26.

Further, since the expansion coefficient of the head-lifting/lowering member 26 is close to that of the pair of rails 28 and the nut members 27, which are each formed of stainless steel, as described above, even when they are heated and thermally expanded, the rails 28 and the head-lifting/lowering member 26 cannot be warped or deformed due to the bimetal effect. Still further, the distance between the rails 28 and the width of the nut members 27 are held approximately constant, so that a decrease in a preload applied by the balls interposed between the rails 28 and the nut members 27 can be prevented. This means that even if frictional heat is generated as a result of an increase in the speed at which components are mounted, i.e. an increase in speed of the nut members 27 sliding on the rails 28, problems are not likely to be caused by thermal expansion of these components and what is more, the adjustment of the preload between the rails 28 and the nut members 27 can be easily carried out as described above.

Figure 8:
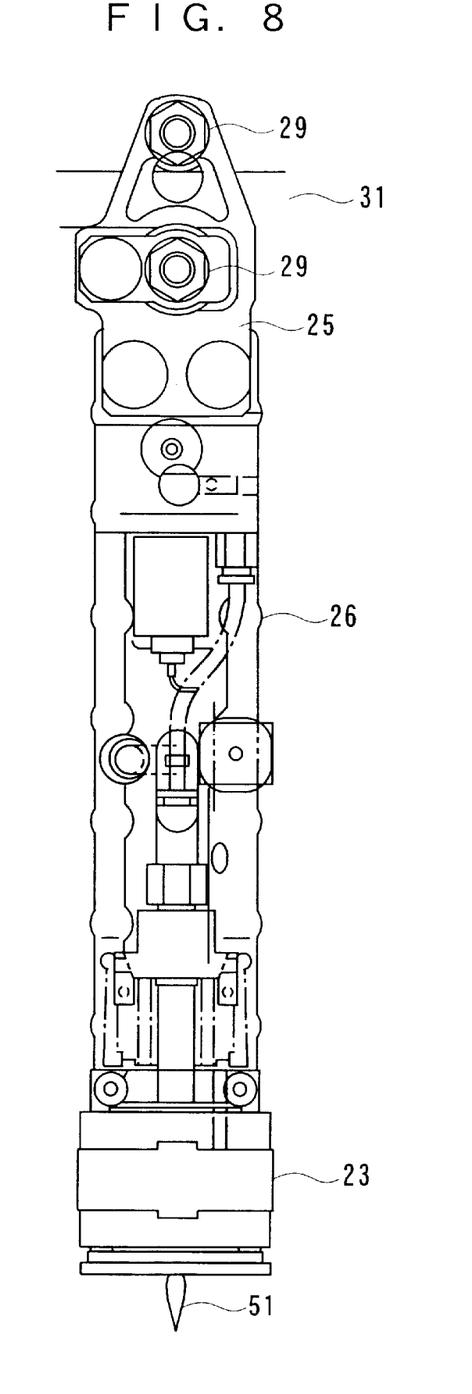
FIG. 8 is a view showing an assembled state of the head-lifting/lowering member.

Referring to FIG. 8, the pair of cam followers 29 are mounted at the upper end of the head-lifting/lowering member 26 via the bracket 25. The upper and lower cam followers sandwich the rib-cam 31 from above and below. The mounting head 23 is attached to the lower end of the head-lifting/lowering member 26.

Although the invention has been described based on the above embodiment, the invention is not limited thereto, but various variations are possible.

Further, although in the above embodiment, the head-lifting/lowering member 26 is formed of the metal-ceramic composite material, the X-Y table and other components may be also formed of this material, as well.

It is further understood by those skilled in the art that the foregoing are preferred embodiments of the invention, and that various changes and modifications may be made without departing from the spirit and scope thereof.

What is claimed is:

1. An automatic electronic component-mounting apparatus comprising:

a main block, a pair of rails, a nut member slidably arranged between said pair of rails, a head-lifting/lowering, member which is to be lowered and lifted with respect to said main block via said pair of rails and said nut member, and a mounting head attached to said head-lifting/lowering member, said head-lifting/lowering member being lowered and lifted to cause said mounting head to pick up an electronic chip component and then mount said electronic chip component on a printed circuit board, wherein said head-lifting/lowering member is formed of a metal-ceramic composite material produced by combining a ceramic reinforcing material with a metal and that has a coefficient of thermal expansion substantially the same as the coefficient of thermal expansion of the material of said pair of rails.

2. The automatic electronic component-mounting apparatus according to claim 1, wherein said metal of said composite is aluminum or an aluminum alloy.

3. The automatic electronic component-mounting apparatus according to claim 2, wherein said nut member is larger in thickness than said pair of rails and is secured to said main block, and wherein said pair of rails are secured to said head-lifting/lowering member.

4. The automatic electronic component-mounting apparatus according to claim 2, wherein said main block comprises a rotary table, and wherein a plurality of said head-lifting/lowering members are arranged on a periphery of said rotary table.

5. The automatic electronic component-mounting apparatus according to claim 1, wherein said nut member is larger in thickness than said pair of rails and is secured to said main block, and wherein said pair of rails are secured to said head-lifting/lowering member.

6. The automatic electronic component-mounting apparatus according to claim 5, wherein said main block comprises a rotary table, and wherein a plurality of said head-lifting/lowering members are arranged on a periphery of said rotary table.

7. The automatic electronic component-mounting apparatus according to claim 1, wherein said main block comprises a rotary table, and wherein a plurality of said head-lifting/lowering members are arranged on a periphery of said rotary table.

8. The automatic electronic component-mounting apparatus comprising:

a main block, a pair of rails, a nut member slidably arranged between said pair of rails, a head-lifting/lowering member which is to be lowered and lifted with respect to said main block via said pair of rails and said nut member, and a mounting head attached to said head-lifting/lowering member, said head-lifting/lowering member being lowered and lifted to cause said mounting head to pick up an electronic chip component and then mount said electronic chip component on a printed circuit board, wherein said head-lifting/lowering member is formed of a metal-ceramic composite material produced by combining a ceramic reinforcing material with a metal, said metal of said composite is aluminum or an aluminum alloy and a volume fraction of said ceramic reinforcing material of said composite is approximately 30%.

9. The automatic electronic component-mounting apparatus according to claim 8, wherein said nut member is larger in thickness than said pair of rails and is secured to said main block, and wherein said pair of rails are secured to said head-lifting/lowering member.

10. The automatic electronic component-mounting apparatus according to claim 8, wherein said main block comprises a rotary table, and wherein a plurality of said head-lifting/lowering members are arranged on a periphery of said rotary table.

* * * * *